US008866181B2

(12) United States Patent
Philippens et al.

(10) Patent No.: US 8,866,181 B2
(45) Date of Patent: Oct. 21, 2014

(54) METHOD FOR PRODUCING A COMPONENT WITH AT LEAST ONE ORGANIC MATERIAL AND COMPONENT WITH AT LEAST ONE ORGANIC MATERIAL

(75) Inventors: Marc Philippens, Regensburg (DE); Tilman Schlenker, Nittendorf (DE); Karsten Heuser, Erlangen (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 180 days.

(21) Appl. No.: 13/388,275

(22) PCT Filed: Jun. 15, 2010

(86) PCT No.: PCT/EP2010/058396
§ 371 (c)(1),
(2), (4) Date: Jun. 11, 2012

(87) PCT Pub. No.: WO2011/012371
PCT Pub. Date: Feb. 3, 2011

(65) Prior Publication Data
US 2012/0241802 A1    Sep. 27, 2012

(30) Foreign Application Priority Data

Jul. 31, 2009    (DE) .......................... 10 2009 035 640

(51) Int. Cl.
*H01L 33/00* (2010.01)
*H01L 23/02* (2006.01)
*H01L 51/52* (2006.01)
*H01L 51/56* (2006.01)

(52) U.S. Cl.
CPC ............ *H01L 51/5237* (2013.01); *H01L 51/56* (2013.01)

USPC ............... 257/99; 257/40; 257/100; 257/678; 257/787; 257/E33.059; 257/E31.117

(58) Field of Classification Search
CPC ............................ H01L 51/5237; H01L 51/56
USPC ...................... 257/99, 678, 40, 787, E33.059, 257/E31.117, 100
See application file for complete search history.

(56) References Cited

U.S. PATENT DOCUMENTS 6,259,204 B1 * 7/2001 Ebisawa et al. ............... 313/512
6,614,057 B2   9/2003 Silvernail et al.
(Continued)

FOREIGN PATENT DOCUMENTS

DE    102004049955    4/2006
DE    202005000979    7/2006
(Continued)

*Primary Examiner* — Jose R Diaz
(74) *Attorney, Agent, or Firm* — Cozen O'Connor

(57) ABSTRACT

In at least one embodiment of the component (10) the latter comprises a first substrate (1) and a second substrate (2), at least one radiation-emitting or radiation-receiving element (3) being arranged on the first substrate (1), which element contains at least one organic material. The first substrate (1) and the second substrate (2) are arranged relative to one another such that the element (3) is located between the first substrate (1) and second substrate (2). The first substrate (1) and second substrate (2) are bonded together mechanically by means of a bonding agent (4) arranged in a sheet between the first substrate (1) and the second substrate (2), which bonding agent contains a glass and surrounds the element (3) with the organic material in the manner of a frame. Furthermore, the component (10) comprises a sealant (5) between the first substrate (1) and the second substrate (2), the sealant (5) surrounding and sealing the element (3) with the organic material and the bonding agent (4) in the manner of a frame.

9 Claims, 2 Drawing Sheets

(56) References Cited

U.S. PATENT DOCUMENTS

| | | |
|---|---|---|
| 6,936,963 B2 | 8/2005 | Langer et al. |
| 6,998,776 B2 | 2/2006 | Aitken et al. |
| 2003/0066311 A1 | 4/2003 | Li et al. |
| 2003/0122476 A1 | 7/2003 | Wang et al. |
| 2007/0170860 A1* | 7/2007 | Choi et al. ............ 313/512 |
| 2007/0194690 A1* | 8/2007 | Lee ..................... 313/498 |
| 2008/0197371 A1 | 8/2008 | Ottermann |

FOREIGN PATENT DOCUMENTS

| | | |
|---|---|---|
| DE | 102005044523 | 3/2007 |
| DE | 102008033017 | 1/2010 |
| EP | 1821352 | 8/2007 |
| EP | 1821353 | 8/2007 |
| WO | WO 2010/006571 | 1/2010 |

* cited by examiner

METHOD FOR PRODUCING A COMPONENT WITH AT LEAST ONE ORGANIC MATERIAL AND COMPONENT WITH AT LEAST ONE ORGANIC MATERIAL

RELATED APPLICATIONS

This application is a U.S. National Phase Application under 35 USC 371 of International Application PCT/EP2010/058396 filed Jun. 15, 2010.

This application claims the priority of Germany application No. 10 2009 035 640.1 filed Jul. 31, 2009, the entire content of which is hereby incorporated by reference.

FIELD OF THE INVENTION

The invention relates to a component with at least one organic material and to a method for the production thereof.

BACKGROUND OF THE INVENTION

Document U.S. Pat. No. 6,936,963 B2 describes an organic radiation-emitting component, which is hermetically sealed by means of a glass solder.

Document U.S. Pat. No. 6,998,776 B2 describes an organic radiation-emitting component, which is hermetically sealed by means of a molten glass frit.

SUMMARY OF THE INVENTION

An object to be achieved is to provide a component with at least one organic material, which is particularly well encapsulated. A further object to be achieved is to provide a method for producing such a component.

According to at least one embodiment of the component, the latter comprises a first substrate and a second substrate. Metals, metal alloys, plastics, semiconductor materials, ceramics or glasses may be used as materials for the substrates. The substrate may be mechanically rigid or mechanically flexible. Preferably at least the first substrate comprises a smooth surface. Smooth here means that the surface is suitable for the application thereon of thin layers, which are necessary for example in the case of organic light-emitting diodes, or OLEDs for short. The thickness of the first and second substrates is in each case preferably in the range between 0.2 mm and 3 mm, particularly preferably between 0.5 mm and 1.5 mm.

According to at least one embodiment of the component, at least one radiation-emitting or radiation-receiving element is arranged on the first substrate, which element contains at least one organic material. The element may take the form of an OLED, for example. In this case, the element preferably comprises at least one cathode, one electron-inducing layer, one electron-conducting layer, one emitting layer, which is based on at least one organic material, one hole-conducting layer, one hole-inducing layer and one anode.

According to at least one embodiment of the component, the first and second substrates are arranged relative to one another such that the element with the at least one organic material is arranged between the first and second substrates. The first and second substrates preferably take the form of flat laminae or plates with in each case mutually facing major sides. The first and second substrates are preferably arranged and/or configured such that the mutually facing major sides are oriented parallel to one another.

According to at least one embodiment of the component, the latter comprises a bonding agent, which is arranged between the first and second substrates. The first and second substrates are bonded together mechanically by means of the bonding agent. The bonding agent is preferably arranged in a sheet, also referred to as track, which surrounds the organic, material-containing element in the manner of a frame. The width of the sheet is preferably in the range of between 0.3 mm and 3 mm, particularly preferably between 0.5 mm and 1 mm.

According to at least one embodiment of the component, the bonding agent contains at least one vitreous constituent or a glass. The bonding agent may in particular take the form of a glass solder or the form of glass frits. The bonding agent may contain admixtures, which serve as binders for instance, which lower the melting point of the bonding agent, which adapt the coefficient of thermal expansion of the bonding agent to the coefficients of thermal expansion of the first and second substrates or which function as spacer elements, by means of which a desired distance is established between the first and second substrates, such that the element with the organic material is at a sufficient distance from the second substrate. Moreover, the bonding agent may contain substances or substance mixtures, such as for example metals or oxides, which may be present in elemental form, ionic form or indeed as particles, which allow melting or curing of the bonding agent for instance by way of electromagnetic radiation from the ultraviolet, visible or infrared spectral range.

According to at least one embodiment of the component, the latter comprises a sealant, which is arranged between the first and second substrates, the sealant surrounding and sealing the element with the organic material and the sheet of bonding agent in the manner of a frame. The sealant preferably exhibits a liquid or high-viscosity consistency before and/or during application and may be cured after application. It is likewise possible for a sealant to be used which is deposited for instance from the gas phase onto substrate and bonding agent, or indeed is present as a solid for instance in the form of a ductile paste and is then cured.

According to at least one embodiment of the component, the bonding agent and/or the sealant comprise(s) at least one admixture. The admixture may for example be a reflection, conversion, filter or diffusion medium.

In at least one embodiment of the component, the component comprises a first substrate and a second substrate, at least one radiation-emitting or radiation-receiving element being arranged on the first substrate, which element contains at least one organic material. The first substrate and the second substrate are arranged relative to one another such that the element is located between the first and second substrates. The first and second substrates are bonded together mechanically by means of a bonding agent arranged in a sheet between the first and second substrates, which bonding agent contains a glass and surrounds the element with the organic material in the manner of a frame. Furthermore, the component comprises a sealant between the first and second substrates, the sealant surrounding and sealing the element with the organic material and the bonding agent in the manner of a frame.

Such an arrangement protects the element with the at least one organic material well relative to external influences such as moisture and oxygen and in this way ensures an increased service life for the component.

A vitreous bonding agent may take the form of a glass solder or the form of glass frits. The bonding agent then consists of a glass material, which preferably has a low melting point. Use of a sealant, which protects the bonding agent in particular from the effects of moisture and prevents ongoing air circulation in the vicinity of the bonding agent may increase the service life of the component.

According to at least one embodiment of the component, the sealant is formed with an anticorrosion agent. The term anticorrosion agent covers all substances and substance mixtures which are suitable for protecting the bonding agent from corrosion, the effects of moisture and/or the action of chemical substances, so as to prevent corrosion of or damage to the bonding agent. The use of an anticorrosion agent prevents detachment of the bonding agent from one of the substrates as a result of corrosion.

According to at least one embodiment of the component, the sealant is at least formed with a lacquer, a silicone, a glass, a spin-on glass, silicon dioxide or a resin, or may consist of one of these substances. These materials have good processability, may be produced inexpensively and offer good protection of the bonding agent for example against moisture.

According to at least one embodiment of the component, a plurality of layers of the sealant are applied. The layers may each be formed of the same material or indeed may be made of different materials. In particular, one layer may seal against oxygen, and another layer against moisture. Layers with absorber materials which absorb moisture, for example, may likewise be used. A multilayer sealant structure results in very effective sealing.

According to at least one embodiment of the component, the surfaces of the bonding agent remote from the element with the organic material and not bonded to the substrate are completely covered by the sealant. However, complete coverage does not here preclude electrodes or conductor tracks, for example, from being guided from the spatial area inside the bonding agent into the spatial area outside the sealant. High ageing resistance is achieved by covering completely the free surfaces of the bonding agent remote from the element.

According to at least one embodiment of the component, at least the first or at least the second substrate is constructed with a glass. Preferably, both substrates are constructed with a glass. If in particular the component takes the form of a light-emitting diode, glasses which may be light-transmitting in the visible spectral range offer the advantage that the radiation emitted by the element may leave the component for the outside largely unimpeded. The substrates may also comprise patterning or roughening on the surfaces, which increases the outcoupling efficiency of the light emitted when the component is in operation. Roughening on the nanometric or micrometric scale is possible in this case, for example. One of the substrates may for example also comprise a mirror coating, such that the light emitted by the element for instance in operation is only emitted outwards towards a substrate. The mirror coating may be metallic and patterned such that electrical conductors for contacting of the element are formed.

According to at least one embodiment of the component, the glass is a soda-lime glass. Soda-lime glasses are also used as window glass and are significantly less expensive than for example borosilicate glasses. Soda-lime glasses additionally exhibit high transparency in the visible spectral range. Moreover, these glasses are transparent in the ultraviolet and near infrared spectral range, which makes it possible, for example, to heat up the bonding agent by way of UV radiation, preferably with wavelengths greater than 300 nm, or with near infrared radiation, with wavelengths preferably lower than 3500 nm. If soda-lime glasses are used together with a sealant, the component may be produced particularly inexpensively and exhibit a long service life.

According to at least one embodiment of the component, the outline of the first and/or second substrate is hexagonal or circular in plan view. This reduces the length of the frame-type sheet of bonding agent, for the same surface area enclosed by the sheet.

According to at least one embodiment of the component, the bonding agent includes spacer elements, by means of which a distance between the first and the second substrates may be fixed. The spacer elements are in particular in direct physical contact with the two substrates. Preferably, end faces of the two substrates are then completely covered by the sealant, with the exception of any electrical conductor tracks.

According to at least one embodiment of the component, the sealant exhibits a minimum extent of 25 μm in a direction parallel to the major side of the first substrate on which the element is mounted. This extent preferably amounts to at least 50 μm, particularly preferably to at least 100 μm. In other words, the bonding agent is protected at least by a sealant layer 25 μm thick. Such a layer is efficient to produce and exhibits good protection against moisture.

According to at least one embodiment of the component, in which the element takes the form of a radiation-emitting organic light-emitting diode, the sealant is transmissive at least for part of the radiation emitted by the light-emitting diode. A transparent or translucent sealant may produce a component emitting on all sides.

According to at least one embodiment of the component, the sealant completely surrounds the outer surfaces of the substrates and of the bonding agent not facing the element. "Completely surrounds" does not however preclude electrical conductors for contacting the element from being guided outwards from the inner spatial area, i.e. the space enclosed by the first and second substrates and by the bonding agent, and from not being covered by the sealant at least in places. In other words, the component is enclosed by the sealant at the complete, outer surfaces thereof, with the exception of any electrical conductors present, which are exposed at least in places to allow the element or the component to be contacted with an external device. Such an arrangement is simple to produce and exhibits good resistance to external influences.

According to at least one embodiment of the component, the distance between the mutually facing major faces of the first and second substrates is at most 75 μm. The distance preferably amounts to at most 50 μm, particularly preferably at most 25 μm, very particularly preferably at most 15 μm. Such a small distance between the substrates allows the production of a space-saving component.

Another aspect of the invention relates to a method for producing a component with an element with at least one organic material. For example, the method may be used to produce a component as described in relation to one or more of the above-stated embodiments.

According to at least one embodiment the method comprises the following method steps:
applying the bonding agent to the second substrate,
applying the element with the at least one organic material to the first substrate,
bonding the first and second substrates by softening and/or curing the bonding agent, and
applying the sealant.

The method steps are preferably performed in the stated order. The method steps may however also be carried out in a different order, depending on specific requirements or process conditions.

The method step of applying the bonding agent may proceed in that pasty glass solders or glass frits are applied to the second substrate. During application, it is necessary in particular to take care that a continuous frame without gaps arises, so as to ensure that the element with the organic material located subsequently inside the bonding agent applied as a sheet and between the two substrates is sealed well. The bonding agent is preferably applied to the second substrate in such a way, for example by sintering, that a mechanically stable bond arises between bonding agent and second substrate.

Application of the element to the first substrate may proceed in that the element is produced separately and then placed on the substrate. It is likewise possible for the element to be produced on the first substrate, i.e. all the necessary layers are for example applied to the first substrate in successive method steps, in order to configure the element for instance as an organic light-emitting diode.

The method step of bonding the first and second substrates is preferably performed by softening and/or curing the bonding agent. The bonding agent may for instance be heated by means of absorption of infrared or UV radiation. In this case, the bonding agent comprises additives, for example, which absorb the corresponding electromagnetic radiation. The bonding agent may also contain admixtures which allow curing of the bonding agent for instance through the absorption of UV radiation. Softening of the bonding agent is preferably implemented by means of radiation which is not or not significantly absorbed by the first and second substrates. "Not significantly" here means that absorption by the substrate(s) amounts to less than 20%, preferably less than 10%, particularly preferably less than 5%.

According to at least one embodiment of the method, the sealant is supplied in the liquid state. The liquid sealant is preferably sucked up between the first and second substrates by a capillary effect. In this case, the sealant has a wetting effect with regard to the substrate surfaces. The capillary effect makes it possible for the sealant to be in direct contact with the bonding agent. The formation of air bubbles, for instance, is preferably prevented in this case for instance by gentle shaking or by rotating the bonded-together substrates during application or curing of the sealant. With this method the substrates are preferably at a distance from one another which is smaller than 75 μm, particularly preferably smaller than 50 μm.

According to at least one embodiment of the method, the sealant is applied at least in places by means of a dipping method. The joined-together substrates bonded by the bonding agent may for example be completely immersed in a bath with a sealant, any electrical conductors which may have been applied to a substrate being covered at least in places for example by a holder and thus not wetted by the sealant. The material forming the electrical conductors may also be such that the sealant does not have a wetting effect with regard to the conductors. The sealant may then be cured for instance thermally or by electromagnetic radiation. The sealant is in this case preferably transparent or translucent for the radiation to be emitted or received by the element. Dipping may also be performed such that only the edges of the substrates and the externally exposed areas of the bonding agent come into contact with the sealant or the sealant bath.

According to at least one embodiment of the method, the sealant is applied at least in places by way of plasma deposition. This may be performed for instance in that a plasma jet generated by means of a plasma torch is directed in targeted manner onto the outwardly exposed areas of the bonding agent and a silicon dioxide layer is formed thereby, for instance.

According to at least one embodiment of the method, the sealant is applied at least in places by means of a spraying or syringe method. The sealant is in this case preferably present in liquid form prior to curing. Alternatively, the sealant may also be applied in a carrier agent, for example a solvent, and cured by evaporation of the solvent.

According to at least one embodiment of the method, the bonding agent is applied before the sealant. The bonding agent is preferably such that it exhibits sufficient impermeability relative to penetration by the sealant, such that the element with the organic material does not come into direct contact with the sealant. In this way, damage to or impairment of the element may be prevented by the sealant.

According to at least one embodiment of the method, the sealant is applied at least in places before or at the same time as the bonding agent. This may take place in that the sealant is applied for instance to the first substrate in a highly viscous state in the manner of a frame. When the substrates are joined together, the sealant may then flow and for example cover at least in places the surfaces of the bonding agent not bonded to the substrates and remote from the element. The sealant may be applied wholly at the same time as the bonding agent, and/or also to the same substrate on which the bonding agent is located. Such a method makes it possible to produce the component inexpensively and efficiently.

According to at least one embodiment of the method, in which the sealant at least partially covers the major faces of the substrates remote from the element, the applied but not yet completely cured sealant is patterned by means of a stamping or embossing method. In this way, lens-like patterning or roughening may for instance be produced cost-efficiently.

The above-described options for applying the sealant may be performed particularly efficiently and in this way allow cost-effective production of the component.

BRIEF DESCRIPTION OF THE DRAWINGS

The component described herein with at least one organic material is explained in greater detail below with reference to exemplary embodiments and the associated figures, in which.

DETAILED DESCRIPTION OF THE DRAWINGS

Figure 1:
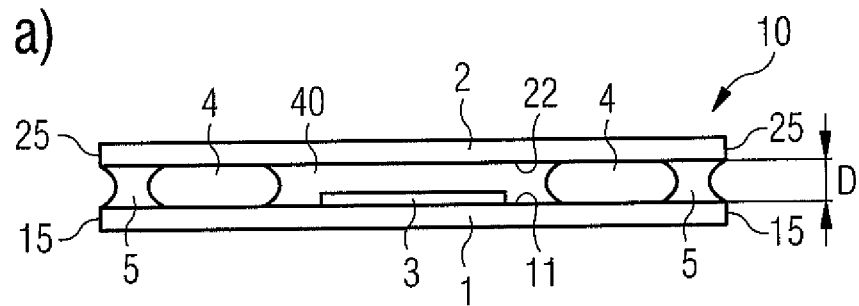
FIG. 1 shows a schematic sectional representation (a) of a side view and a schematic plan view (b) of an exemplary embodiment of a component.
Figure 1:
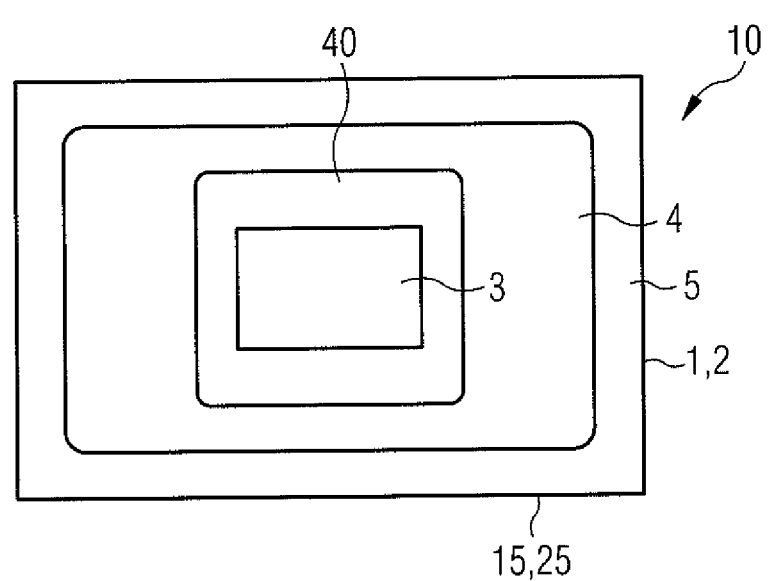

FIG. 1 is an exemplary embodiment of a component 10 comprising an element 3 with at least one organic material. The element 3 takes the form of an organic light-emitting diode mounted on the top 11 of a first substrate 1. Between the first substrate 1 and a second substrate 2 there is located a sheet of a bonding agent 4, which surrounds the element 3 in the manner of a frame. A closed space or cavity 40, in which the element 3 is located, is thus formed by the first substrate 1 and second substrate 2 and the bonding agent 4.

The surfaces of the bonding agent 4 remote from the element 3 and not bonded to the first substrate 1 or second substrate 2 are surrounded by a sealant 5. Said surfaces of the bonding agent 4 are completely covered by the sealant 5. The second substrate 2 comprises a bottom 22 facing the element 3. Top 11 and bottom 22 are spaced by a distance D, which amounts to around 25 µm.

The end faces 15, 25 of the first substrate 1 and second substrate 2 respectively, which connect together the major sides of the first substrate 1 and second substrate 2 respectively, are not covered by the sealant 5.

The sealant 5 is formed for example with a low viscosity silicone. The silicone is applied laterally to the substrates 1, 2, for instance with a syringe. The sealant 5 is then sucked into the interspace located between first substrate 1 and second substrate 2 outside the cavity 40 by a capillary effect. The sealant 5 wets the substrates 1, 2 and the bonding agent 4 and is in direct contact therewith. In this way, an impermeable seal is obtained, which is at the same time simple to be produce.

Figure 2:
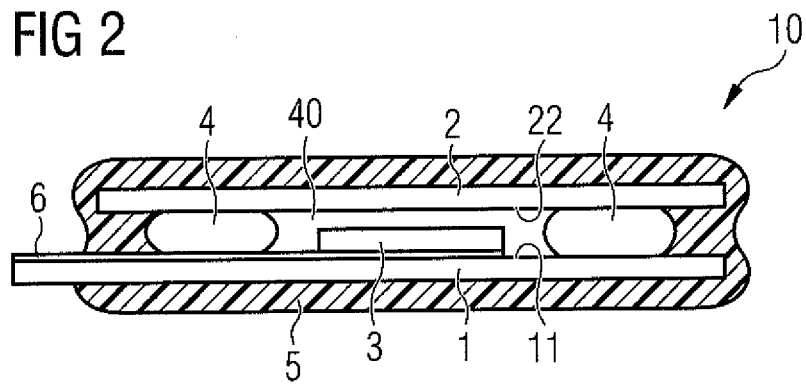
FIG. 2 is a schematic sectional representation of an exemplary embodiment of a component completely enveloped in sealant.

The exemplary embodiment according to FIG. 2 includes electrical conductors 6, which are applied to the top 11 of the first substrate 1 and bring about an electrically conductive connection between the element 3 and the spatial area outside the cavity 40, the connecting means 4 and the sealant 5. To allow simple pick-up of the electrical conductors 6, the first substrate projects on one side laterally relative to the second substrate 2. Apart from these laterally projecting parts of the first substrate 1, the outer boundary surface of the component 1 is completely surrounded by the sealant 5, which may be applied by a dipping method.

The sealant 5 may optionally have an admixture added to it, for example in the form of a filter medium, a conversion medium or a diffuser. The admixture may be limited just to certain regions of the applied sealant 5.

In a further option the sealant 5 applied for instance by dipping is patterned by a stamping or embossing process before it is completely cured, for example to produce microlenses or Fresnel lenses. It is likewise possible for the sealant 5 applied over the entire surface to exhibit properties, for example to be tacky, which allow it to be mounted on an external carrier, not shown, without major effort.

The electrical conductors 6 may be made from a transparent, electrically conductive material, for example indium-tin oxide, or consist of vapour-deposited metal layers, which are preferably reflective for the radiation to be received or emitted by the element 3.

Figure 3:
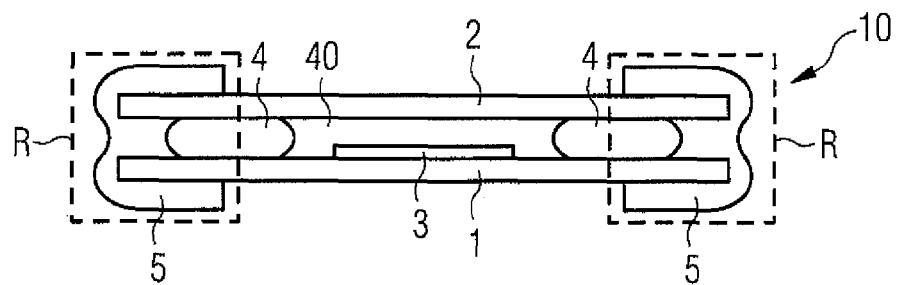
FIG. 3 is a schematic sectional representation of an exemplary embodiment of a component.

In the exemplary embodiment according to FIG. 3, which may be produced for instance by a dipping method, only peripheral areas R, i.e. areas which are located close to the edges of the substrates 1, 2, are covered by the sealant 5. The sealant 5 thus extends in places onto the sides of the first substrate 1 and second substrate 2 remote from the element 3. The peripheral area R extends at least in part laterally from the outer edges, preferably as far as into areas in which the bonding agent 4 is located between the substrates 1, 2.

Figure 4:
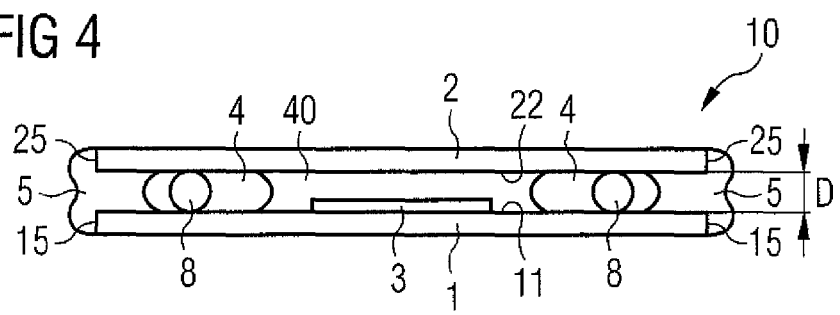
FIG. 4 is a schematic sectional representation of an exemplary embodiment of a component with spacer elements.

In the exemplary embodiment according to FIG. 4, the sealant 5 is applied such that the end faces 15, 25 of the first substrate 1 and second substrate 2 are completely covered by the sealant 5. The sealant 5 may for example be applied by means of a sputtering process or by plasma deposition. Spacer elements 8 are added to the bonding agent 4, by means of which the distance D between the top 11 and bottom 22 of the first substrate 1 or second substrate 2 respectively is established.

Reflective constituents may for example optionally also be added to the bonding agent 4, which increase the outcoupling efficiency of the light emitted by the element 3, which for instance takes the form of an organic light-emitting diode.

Figure 5:
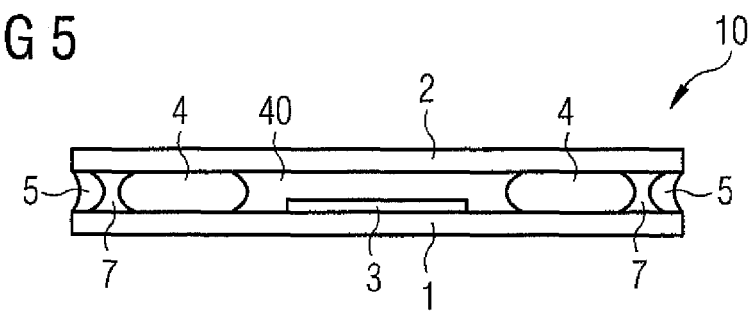
FIG. 5 is a schematic sectional representation of an exemplary embodiment of a component with an absorber material.

The exemplary embodiment according to FIG. 5 resembles the component 10 shown in FIG. 1, but an absorber material 7 is mounted between bonding agent 4 and sealant 5. The absorber material 7 serves to absorb water or moisture or indeed oxygen which may penetrate through the sealant 5 and additionally to protect the element 3 and/or the bonding agent 4 from corrosive action.

Figure 6:
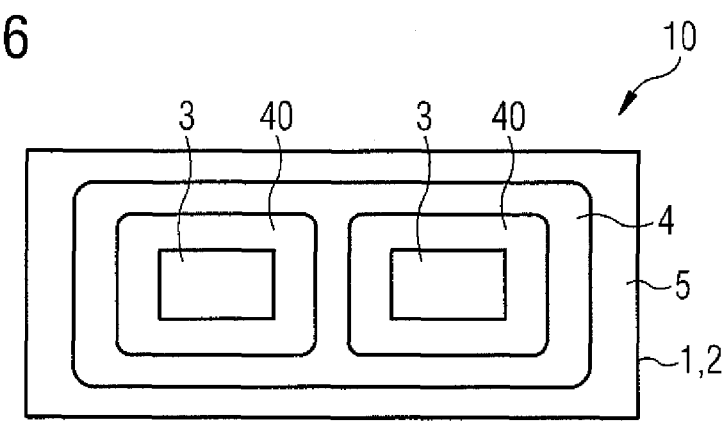
FIG. 6 is a schematic plan view of an exemplary embodiment of a component with a plurality of elements.

The component 10 according to FIG. 6 comprises a plurality of elements 3, for example two elements 3, as shown. The elements 3 are each surrounded by a frame of a bonding agent 4 arranged in a sheet. The surfaces of the bonding agent 4 remote from the elements 3 and externally exposed are covered by a sealant 5. The sealant 5 in this case forms a single peripheral frame surrounding all the elements 3 enclosed by the bonding agent 4.

The invention described herein is not restricted by the descriptions given with reference to the exemplary embodiments. Rather, the invention encompasses any novel feature and any combination of features, including in particular any combination of features in the claims, even if this feature or this combination is not itself explicitly indicated in the claims or exemplary embodiments.

The invention claimed is:

1. A component comprising a first substrate and a second substrate, comprising:
   at least one element emitting radiation and containing at least one organic material arranged on the first substrate, wherein the first substrate and the second substrate are arranged relative to one another such that the element is arranged between the first substrate and the second substrate;
   a sheet of a bonding agent arranged between the first substrate and the second substrate, wherein the bonding agent contains a glass and the sheet of the bonding agent surrounds the radiation-emitting element in the manner of a frame and bonds the first substrate and the second substrate together mechanically; and
   a sealant arranged between the first substrate and the second substrate, the sealant surrounding and sealing the element and the sheet of the bonding agent in the manner of a frame,
   wherein the sealant extends onto outer sides of the first substrate and the second substrate remote from the element and from outer edges of the first substrate and the second substrate as far as into areas in which the bonding agent is located between the first substrate and the second substrate, so that all edges of the sealant on the first and the second substrate lie within an area in which the bonding agent has been applied to the first and the second substrate, when seen in top view,
   wherein the component is an organic light-emitting diode,
   wherein the sealant contains at least one of a lacquer, a silicone and a resin,
   wherein the sealant has an admixture added to it, the admixture being one from the group consisting of: a filter medium, a conversion medium and a diffuser, and the sealant has a minimum thickness of 50 µm, and
   wherein the surfaces of the bonding agent remote from the element and not bonded to a substrate are completely covered by the sealant.

2. The component according to claim 1, wherein the sealant is formed with an anticorrosion agent.

3. The component according to claim 1, wherein the sealant consists of a lacquer.

4. The component according to claim 1, wherein at least one of the first substrate and the second substrate comprises or consists of glass.

5. The component according to claim 4, wherein the glass is a soda-lime glass.

6. The component according to claim 1, wherein the sealant exhibits a minimum extent of 25 μm in a direction parallel to the first substrate.

7. The component according to claim 1, wherein the element emits radiation when in operation, and the sealant is transmissive to at least part of the radiation.

8. The component according to claim 7, wherein the sealant completely encloses the outer surfaces, remote from the element, of the substrates and of the bonding agent, with the exception of electrical conductors for contacting the element.

9. The component according to claim 1, wherein the distance between the first substrate and the second substrate amounts to at most 75 μm.

* * * * *